(12) United States Patent  
Tsironis

(10) Patent No.: US 8,405,466 B2  
(45) Date of Patent: Mar. 26, 2013

(54) WIDEBAND LOW FREQUENCY IMPEDANCE TUNER

(76) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 13/525,883

(22) Filed: Jun. 18, 2012

(65) Prior Publication Data

US 2013/0002367 A1     Jan. 3, 2013

Related U.S. Application Data

(63) Continuation of application No. 12/654,463, filed on Dec. 22, 2009, now Pat. No. 8,212,629.

(51) Int. Cl.
*H03H 7/38* (2006.01)
*H01P 1/18* (2006.01)

(52) U.S. Cl. .................. 333/17.3; 333/162; 333/139

(58) Field of Classification Search ............... 333/17.3, 333/139, 156, 162, 163
See application file for complete search history.

(56) References Cited

U.S. PATENT DOCUMENTS

| | | | |
|---|---|---|---|
| 3,099,807 A | 7/1963 | Oh | |
| 3,340,485 A | 9/1967 | Caron | |
| 3,391,355 A | 7/1968 | Felsenheld | |
| 3,519,963 A | 7/1970 | Lyon | |
| 5,771,026 A | 6/1998 | Stengel, Jr. | |
| 6,674,293 B1 | 1/2004 | Tsironis | |
| 7,135,941 B1 | 11/2006 | Tsironis | |
| 7,646,267 B1 | 1/2010 | Tsironis | |
| 7,646,268 B1 | 1/2010 | Tsironis | |
| 8,212,628 B1 | 7/2012 | Tsironis | |

*Primary Examiner* — Stephen Jones

(74) *Attorney, Agent, or Firm* — Husch Blackwell LLP

(57) ABSTRACT

Compact electro-mechanical impedance tuners for frequencies as low as 1 MHz use the concept of a cylindrical transmission line with the signal conductor being a spiral wire wound around a metallic cylinder and separated from it by a layer of dielectric material. A conductive wheel is running over the spiral wire and, as the cylinder rotates, the transmission phase between one terminal of the spiral wire and the wheel changes. By connecting a rotating parallel plate variable capacitor to the wheel creates an impedance tuner, capable of generating high reflection factors at very low frequencies at any area of the Smith chart. By cascading two or more such tuners allows tuning at harmonic frequencies at the rate of one frequency per tuner section. The reduction in size comparing with traditional transmission line tuners is of the order of 150:1.

29 Claims, 25 Drawing Sheets

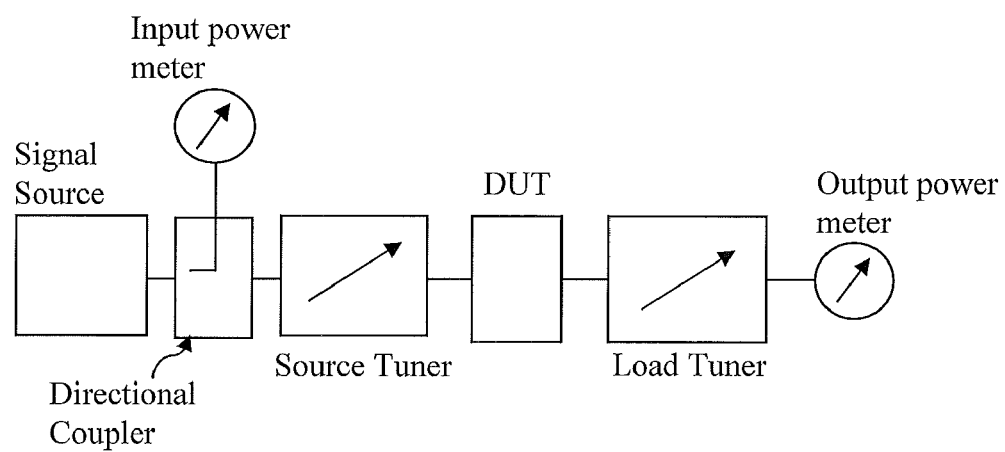
FIGURE 1: Prior art, Load Pull measurement setup

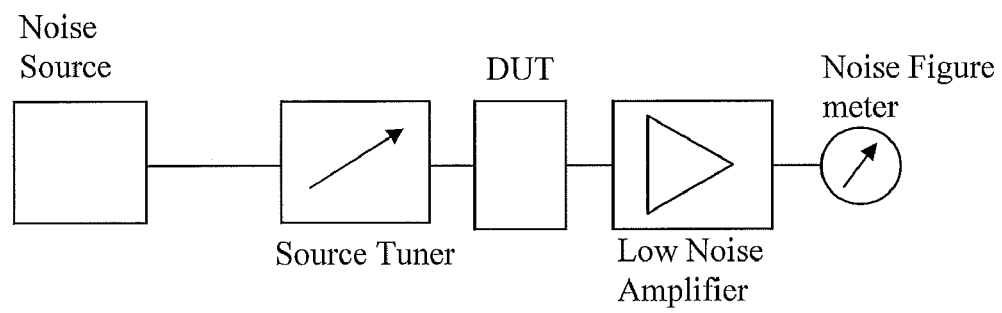
FIGURE 2: Prior art, Noise measurement setup

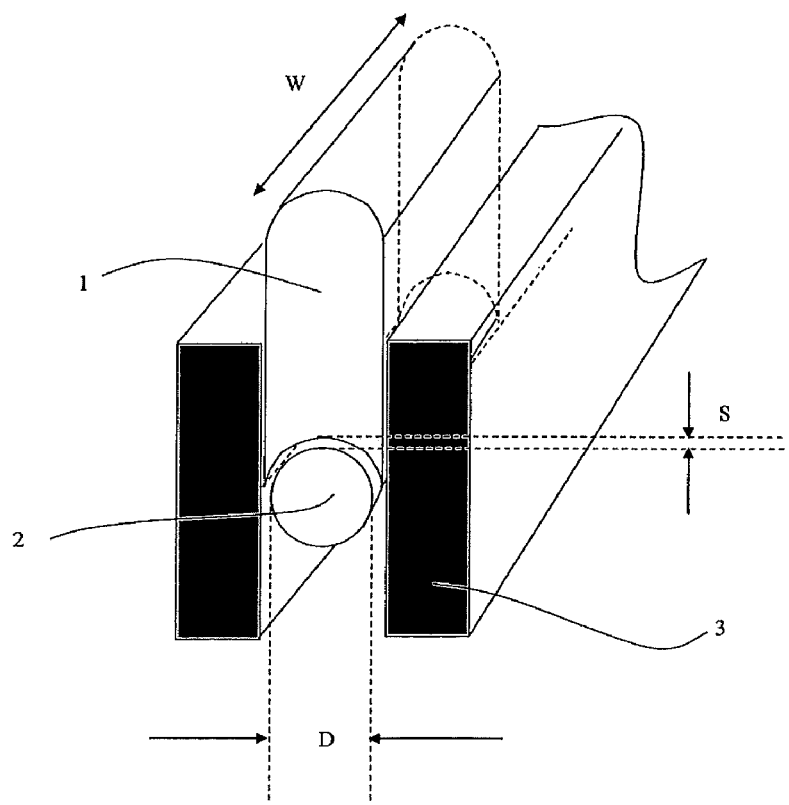
FIGURE 3: Prior art, cross section of slabline based slide screw tuner

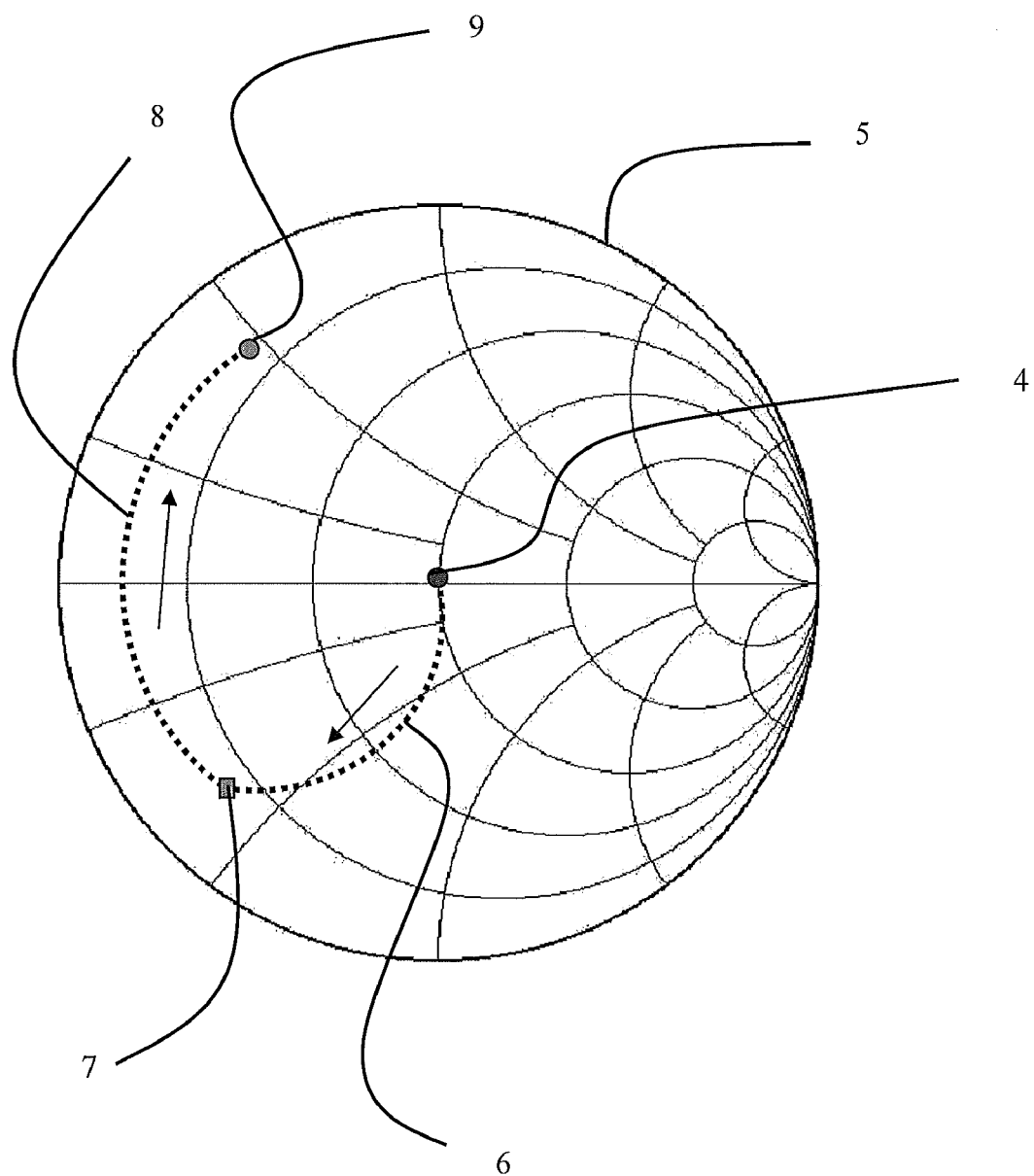
FIGURE 4: Prior art, tuning mechanism of a slide screw tuner

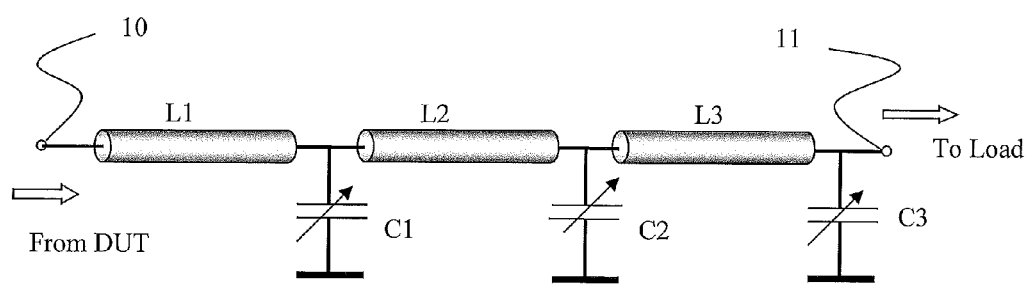
FIGURE 5: Prior art, triple Line-Capacitor impedance tuner

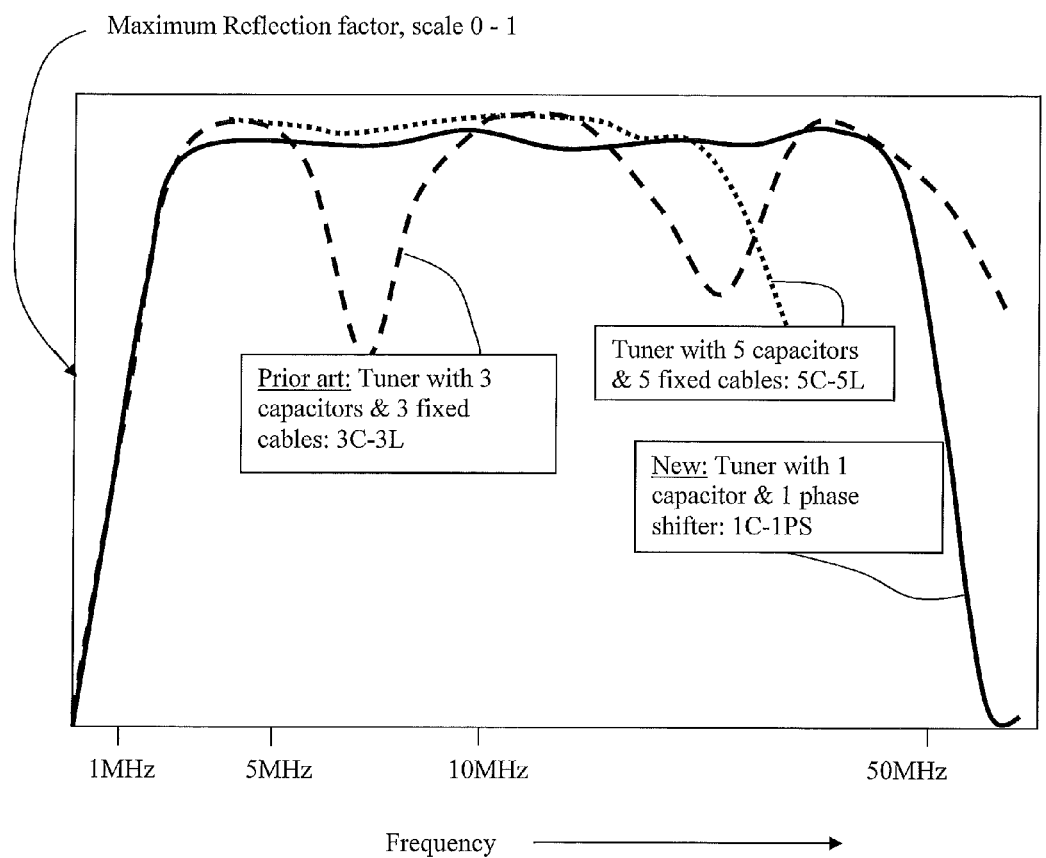
FIGURE 6: Partly prior art, comparison of frequency coverage of tuners.

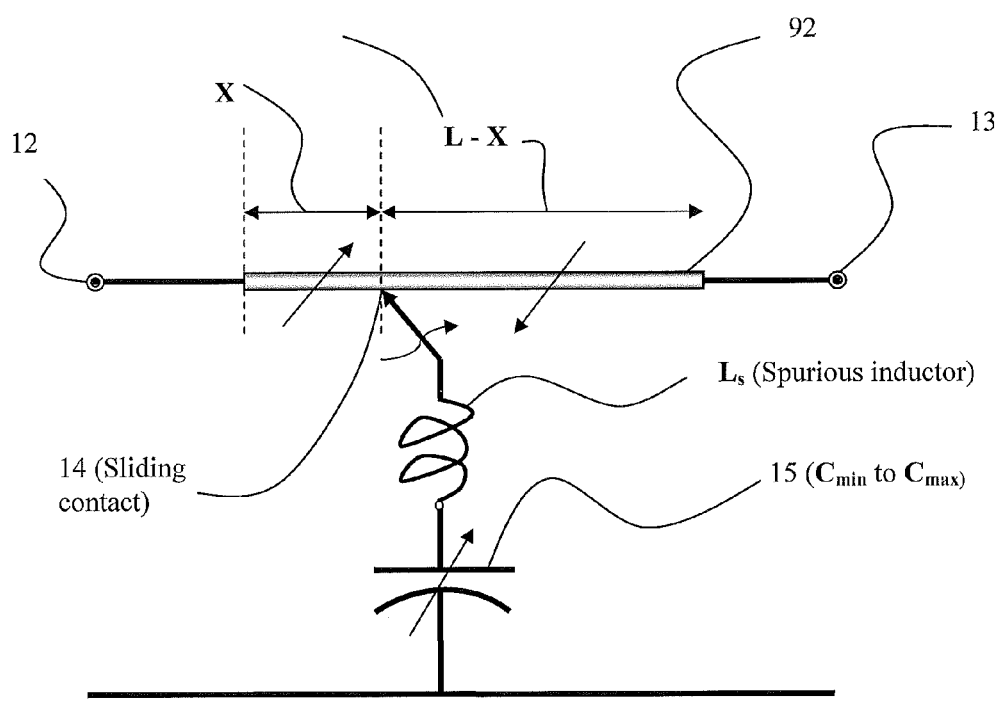
FIGURE 7: Principle of "one Capacitor – one Phase Shifter" Impedance Tuner

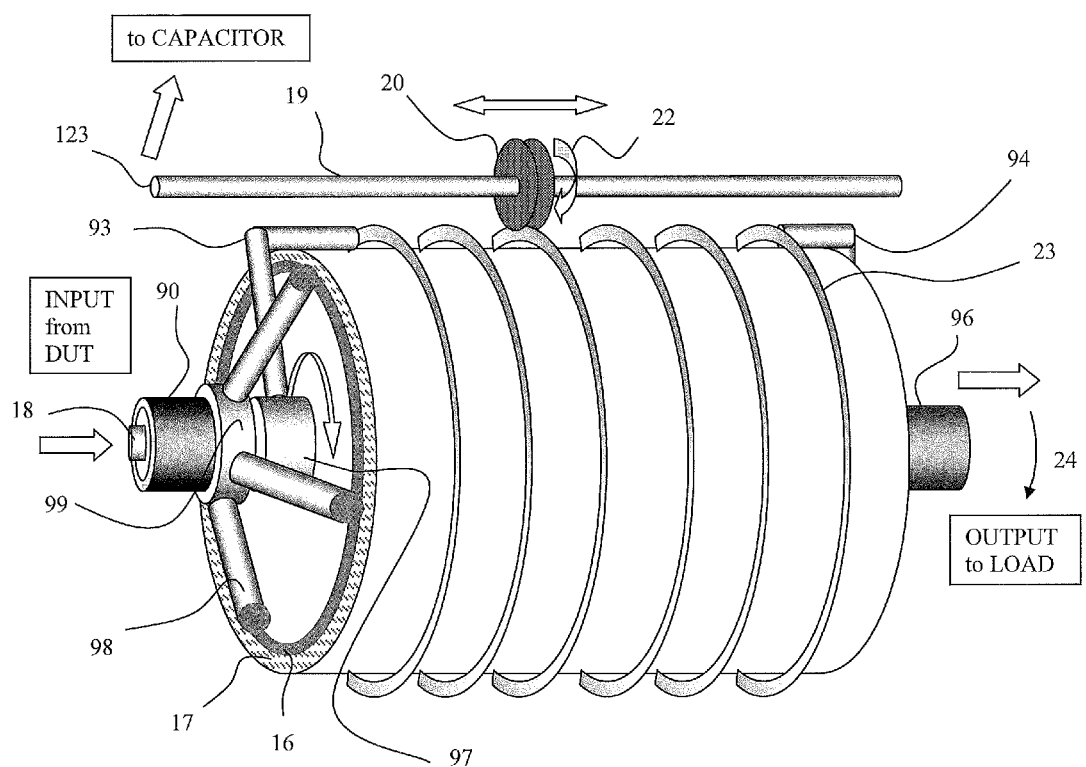
FIGURE 8: Linear phase shifter using a spiraled rotating transmission line

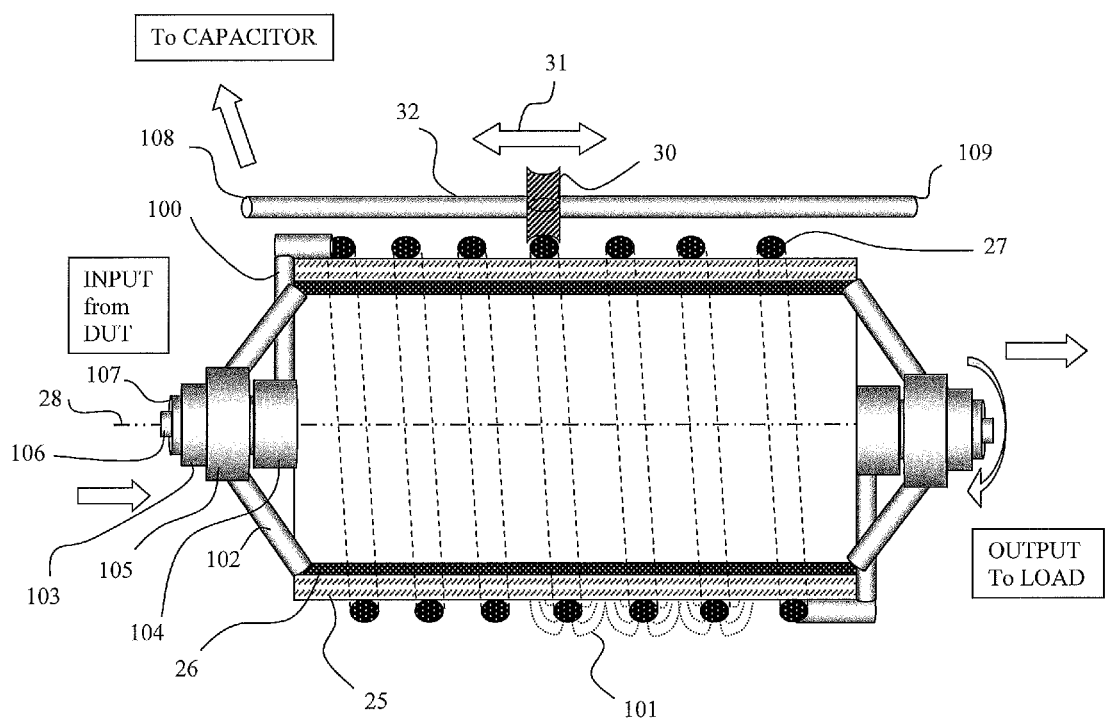
FIGURE 9: Cross section of linear phase shifter using a spiraled rotating transmission line

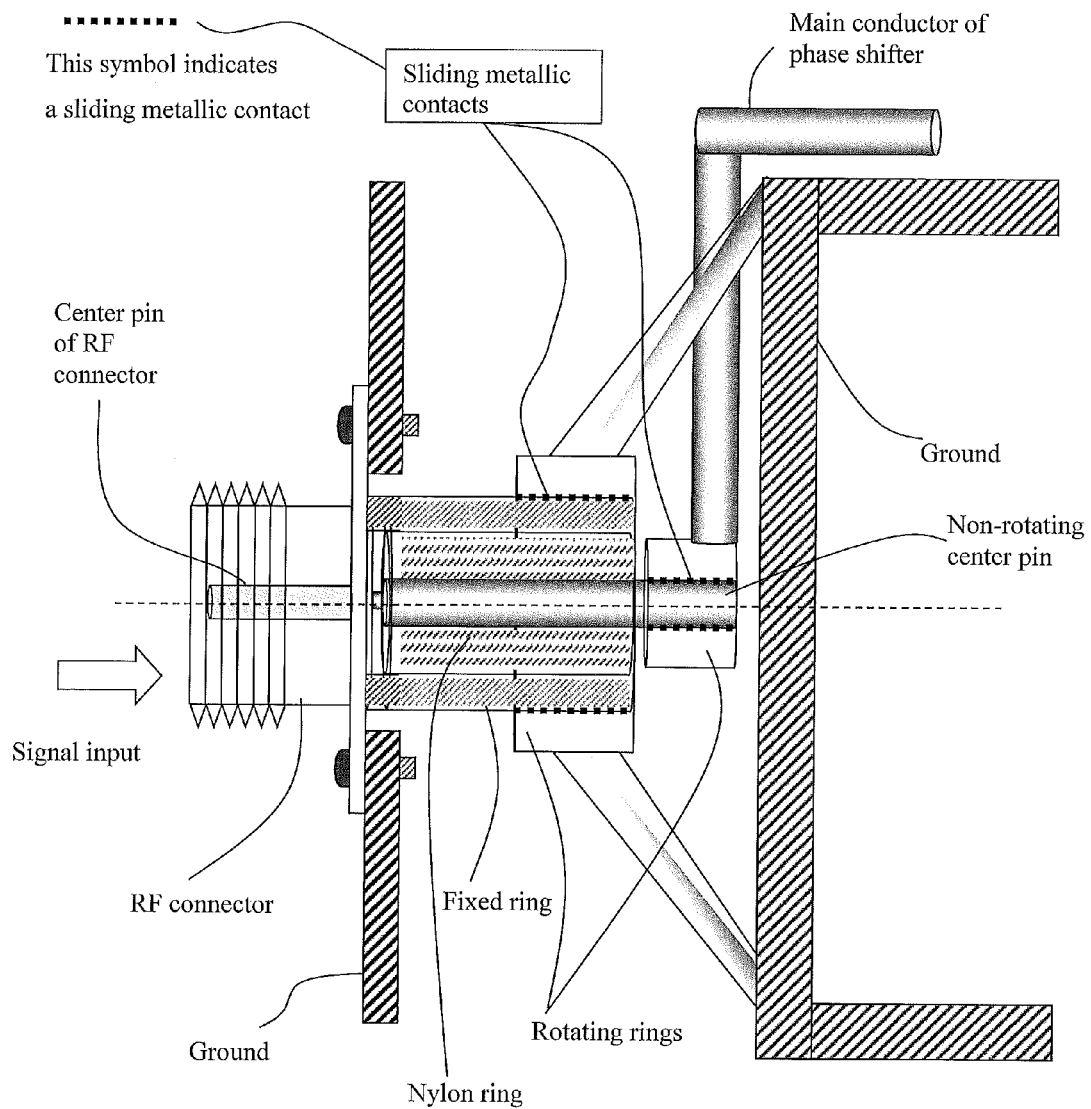
FIGURE 10: Coaxial adapter transition to rotating phase shifter.

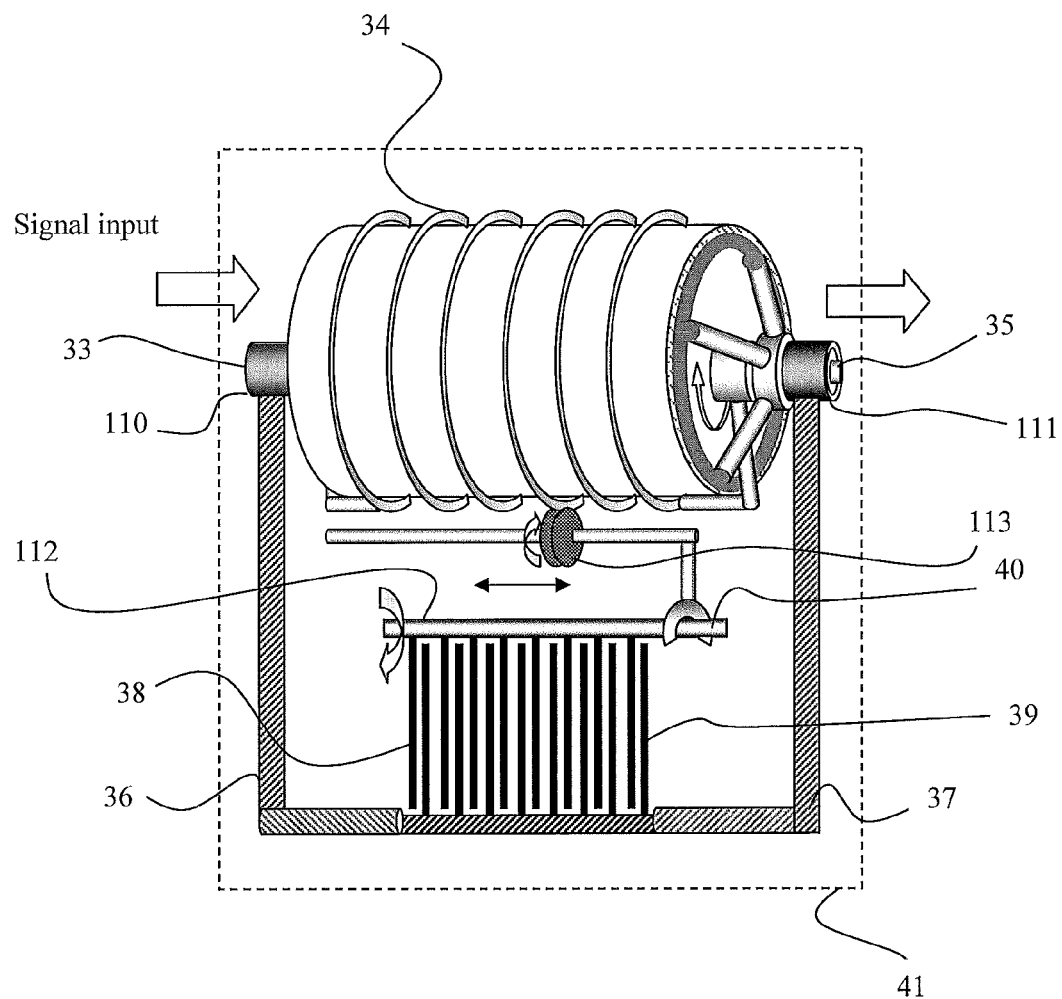
FIGURE 11: Low frequency impedance tuner

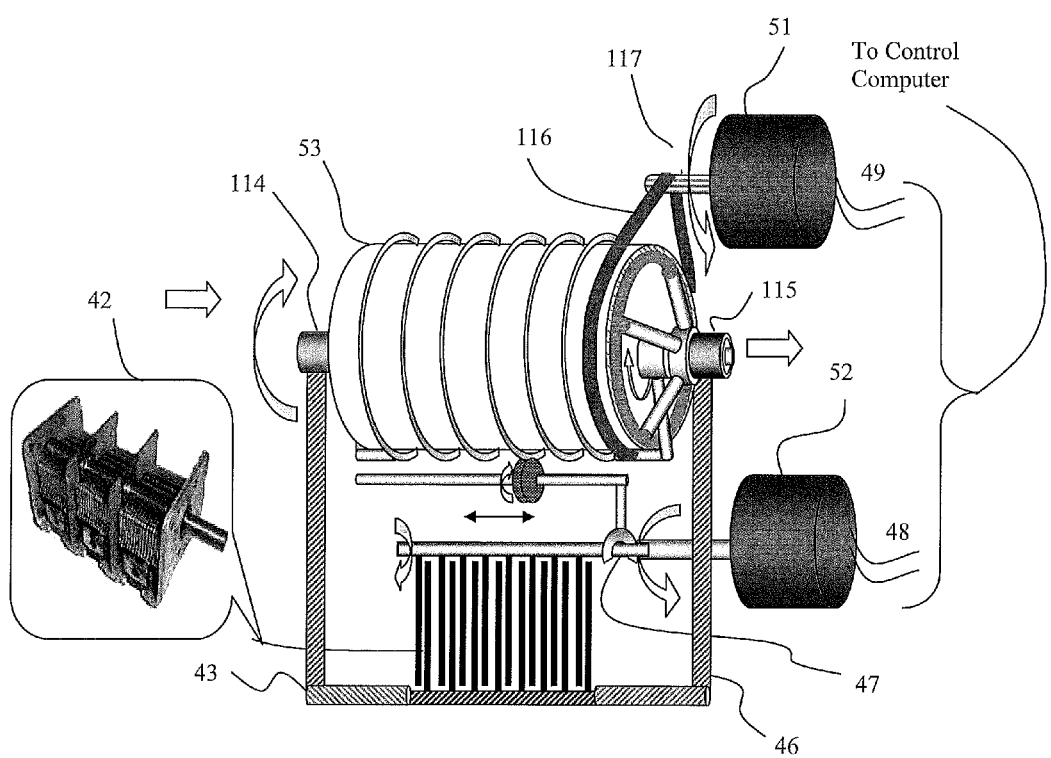
FIGURE 12: Automated low frequency impedance tuner

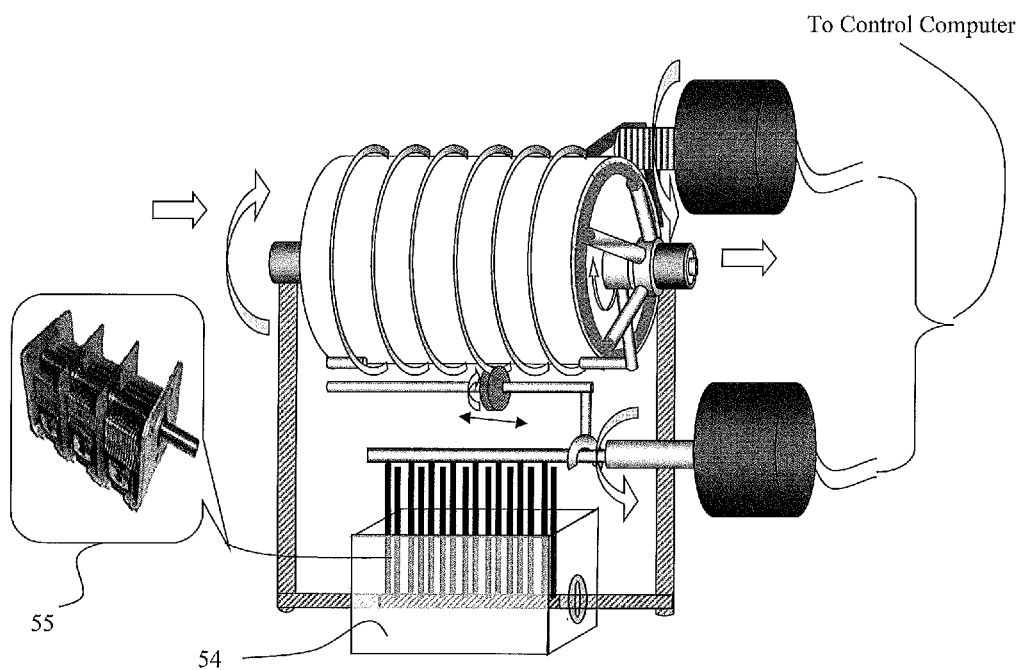
FIGURE 13: Impedance tuner with capacitor immersed in dielectric liquid

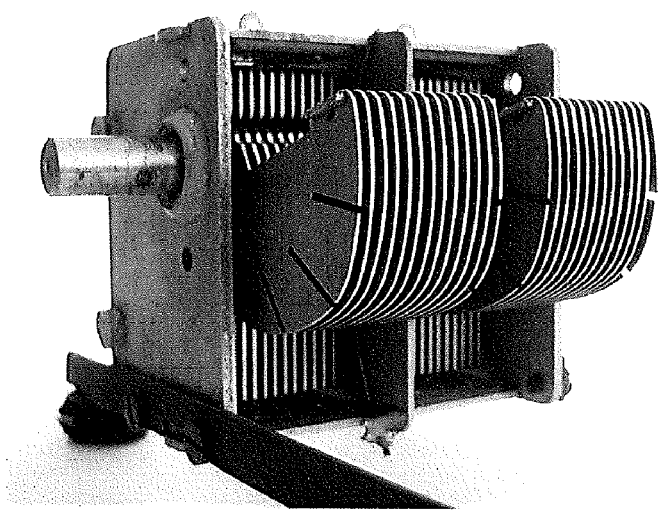
FIGURE 14 a): Prior art, variable rotary capacitor
Conductive wheel
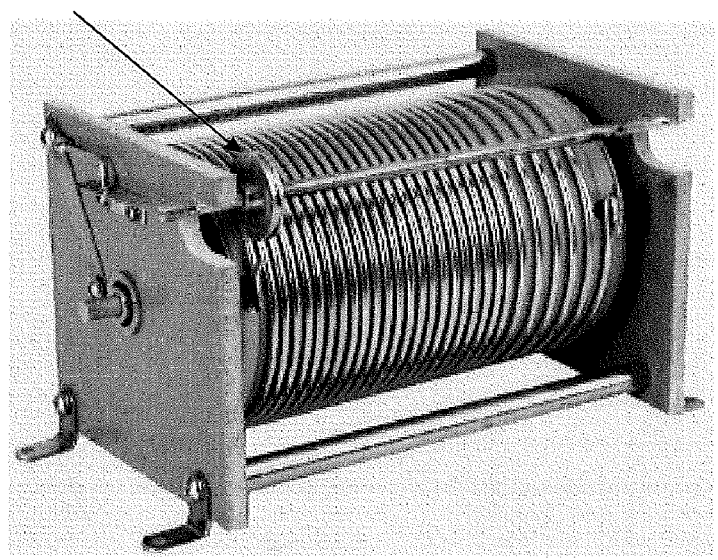
FIGURE 14 b): Prior art, variable rotating inductor

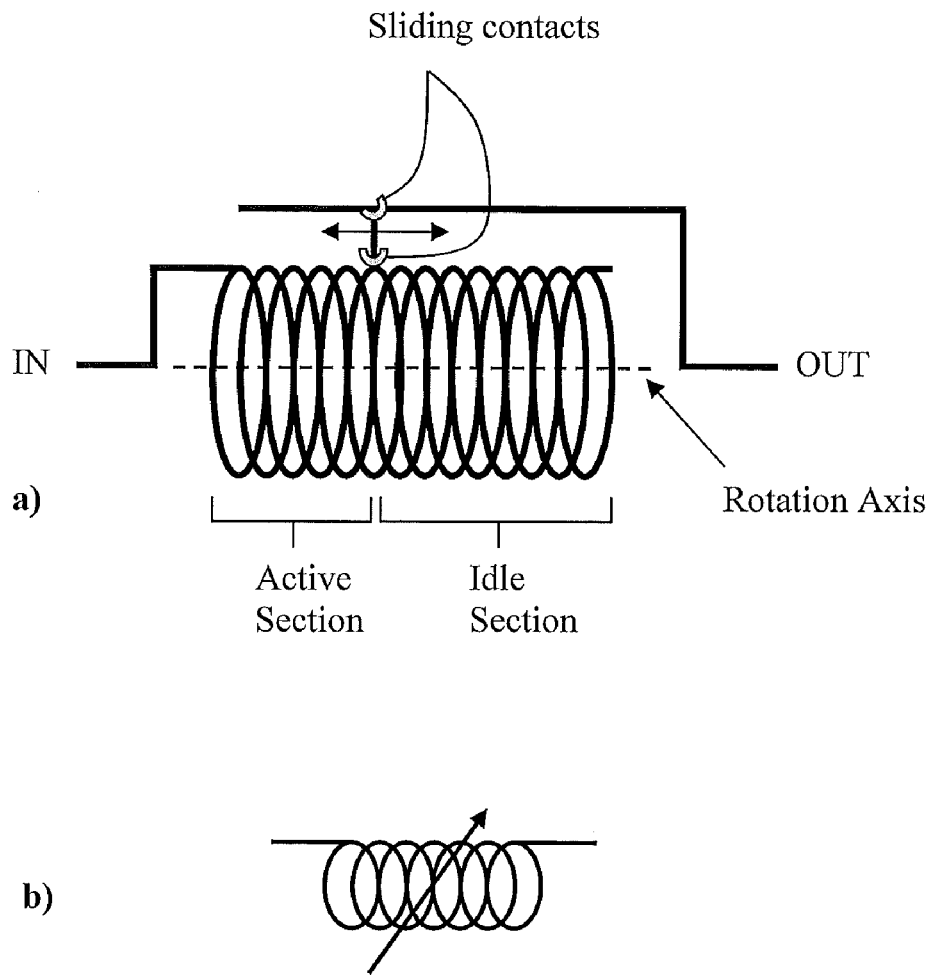
FIGURE 15: Prior art: a): Schematics of variable rotating inductor, b) Electrical symbol thereof.

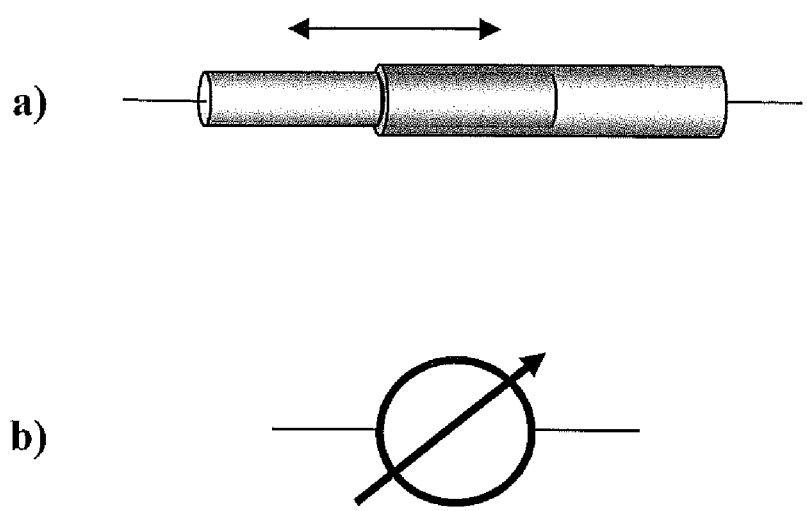
FIGURE 16, prior art: a) Variable transmission line phase shifter, b) electrical symbol thereof.

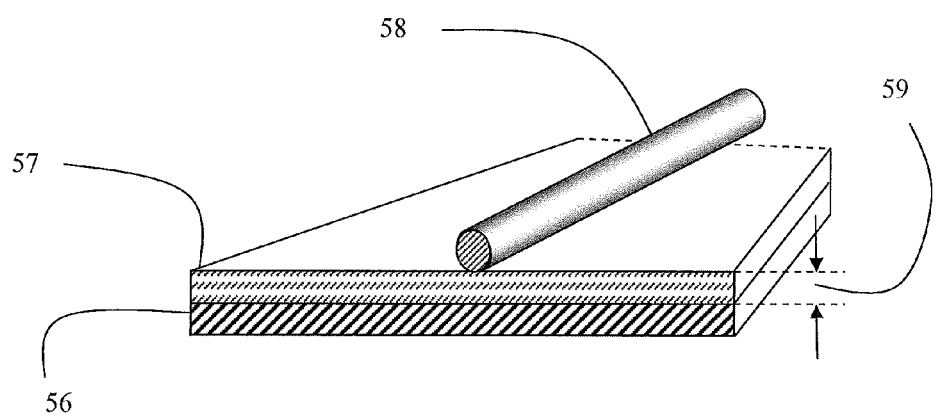
Figure 17, prior art: Cross section of transmission line using dielectric (wire over ground-plane)

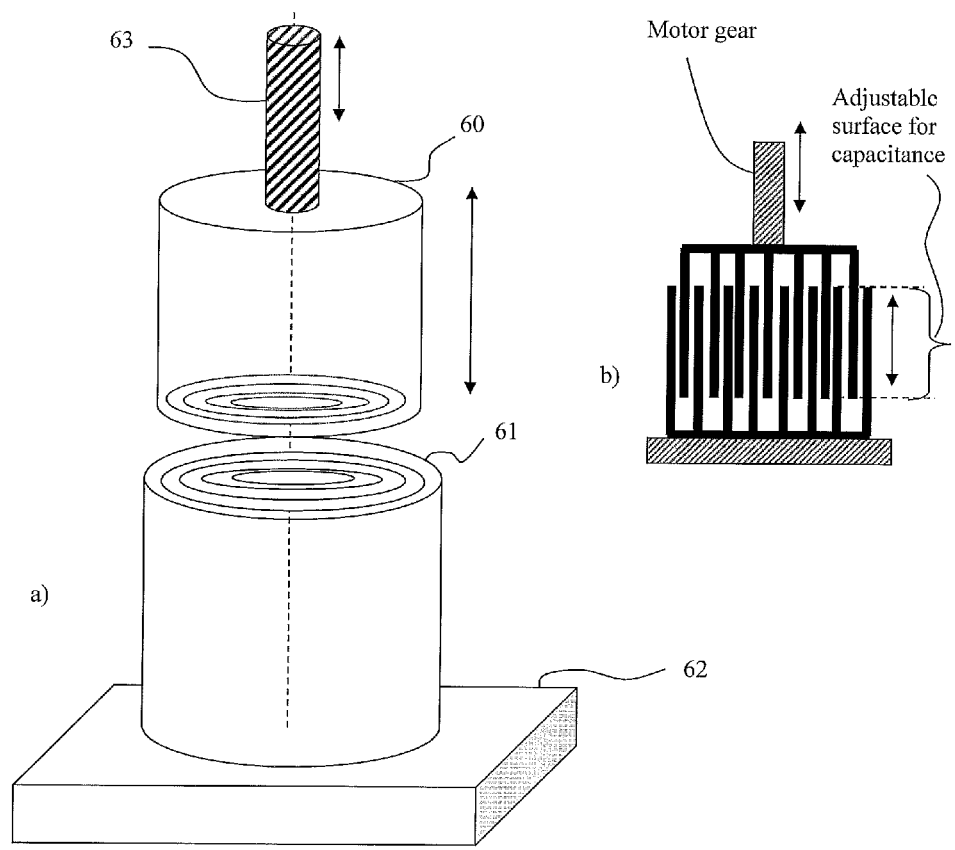
FIGURE 18: a) Prior art: Variable capacitor using concentric conductive cylinders; b) Cross section.

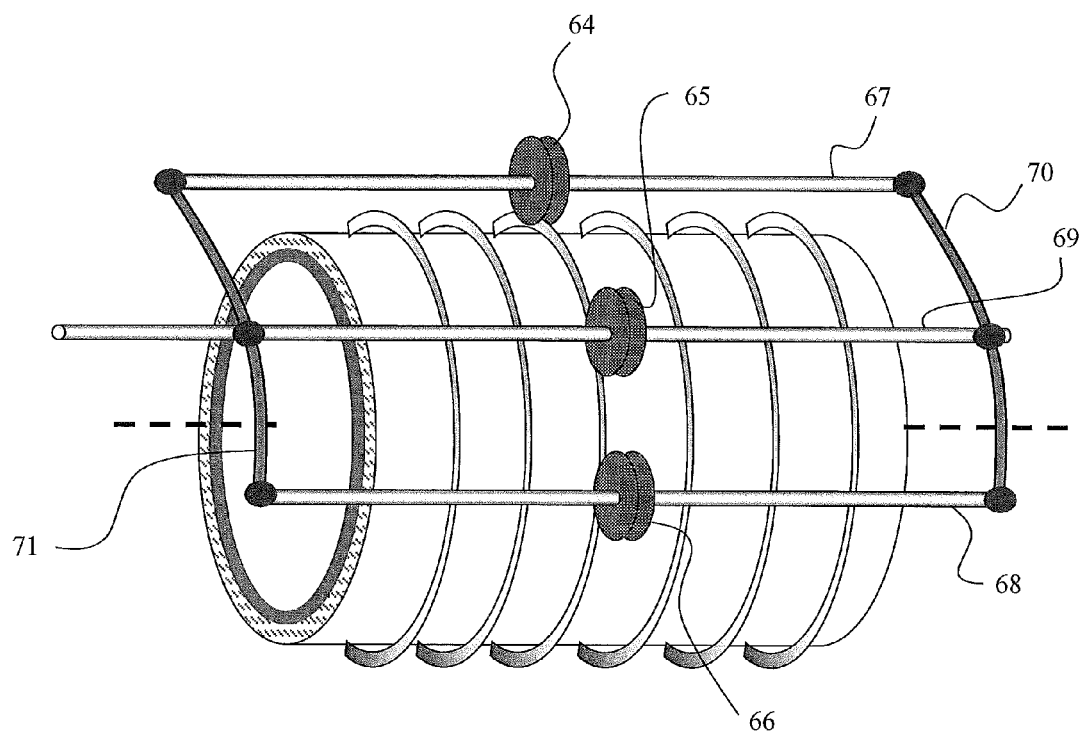
FIGURE 19: Linear, high power, phase shifter.

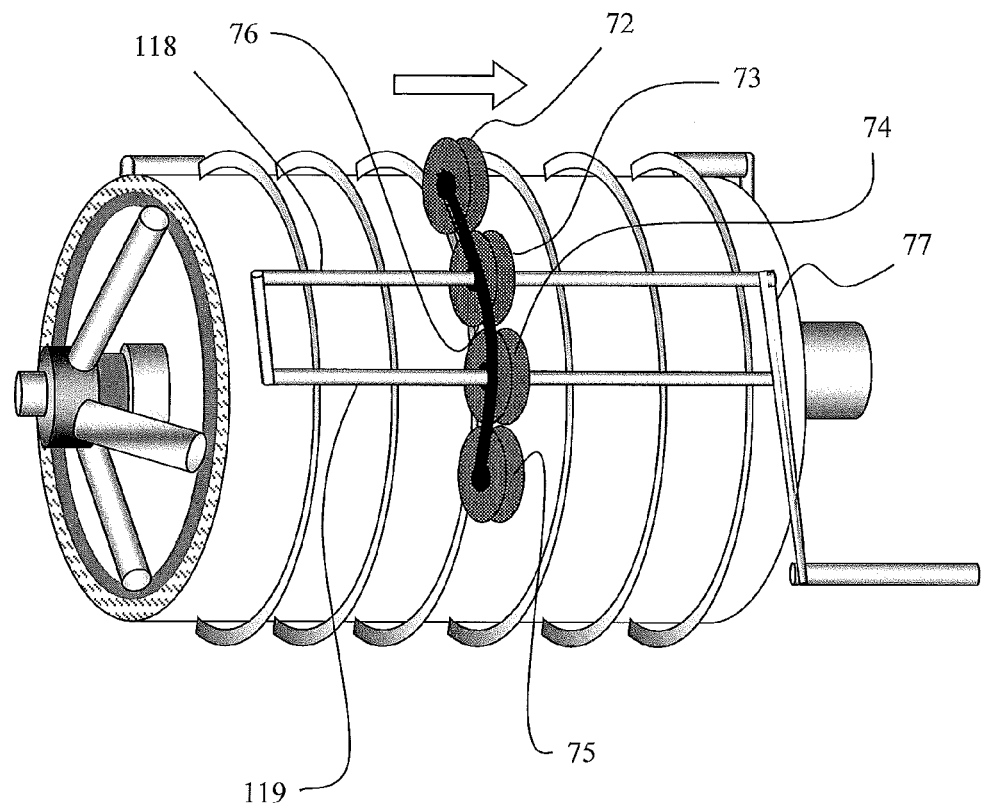
FIGURE 20: Linear, high power phase shifter.

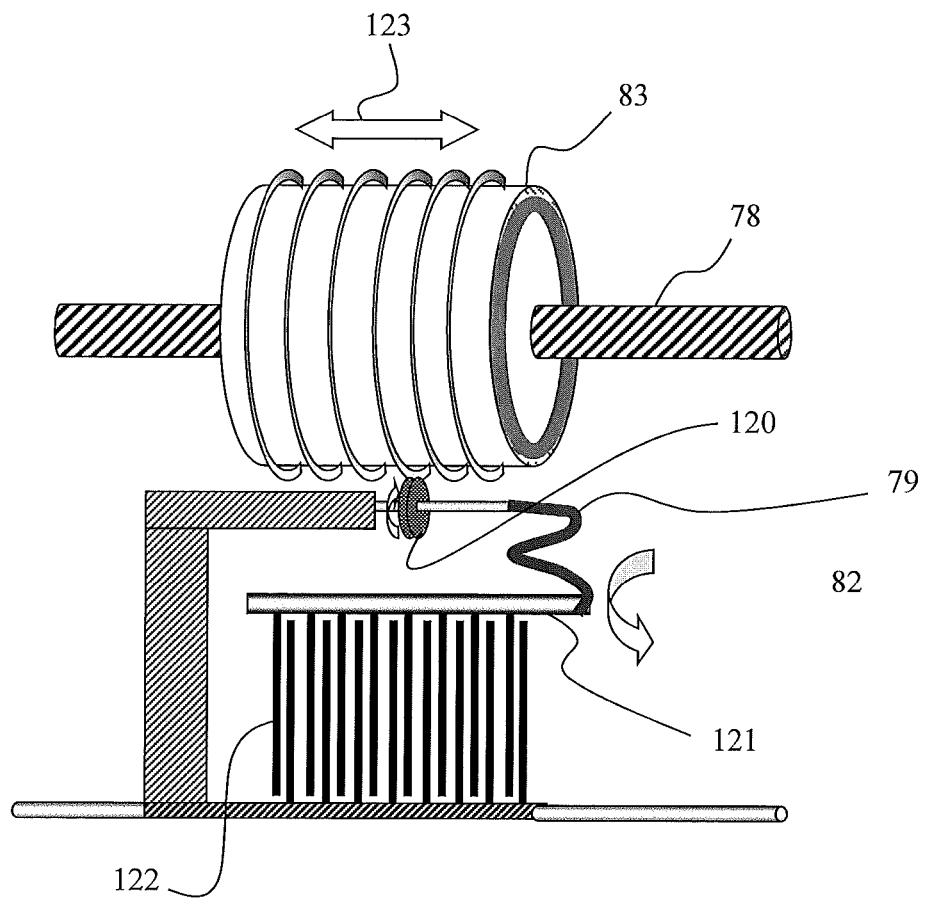
FIGURE 21: Tuner using linear, high power phase shifter and variable capacitor.

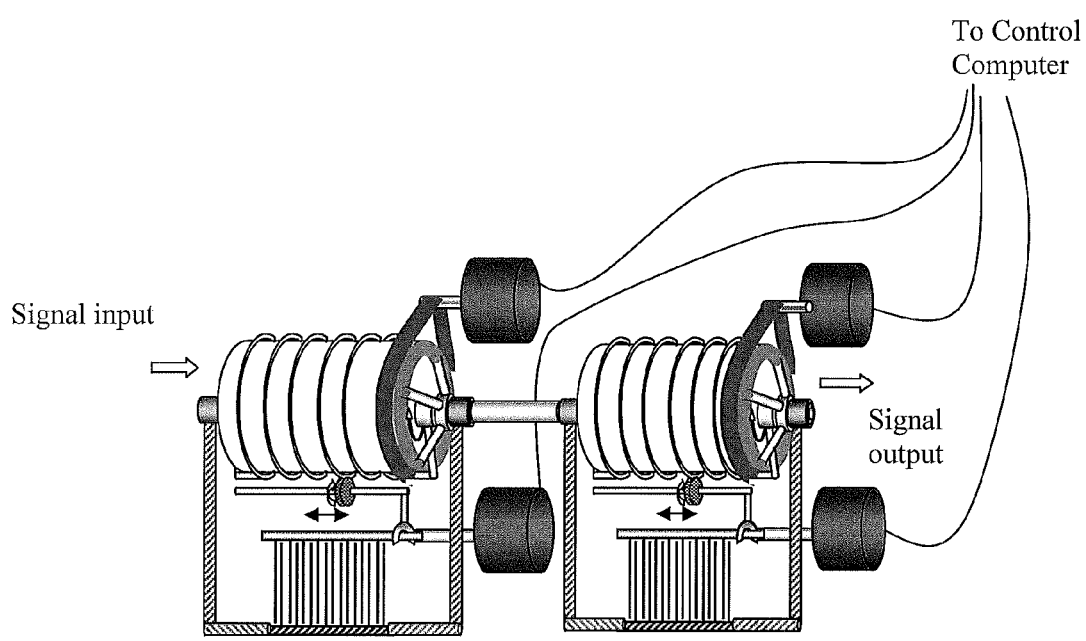
FIGURE 22: Two stage pre-matching or two-frequency harmonic tuner

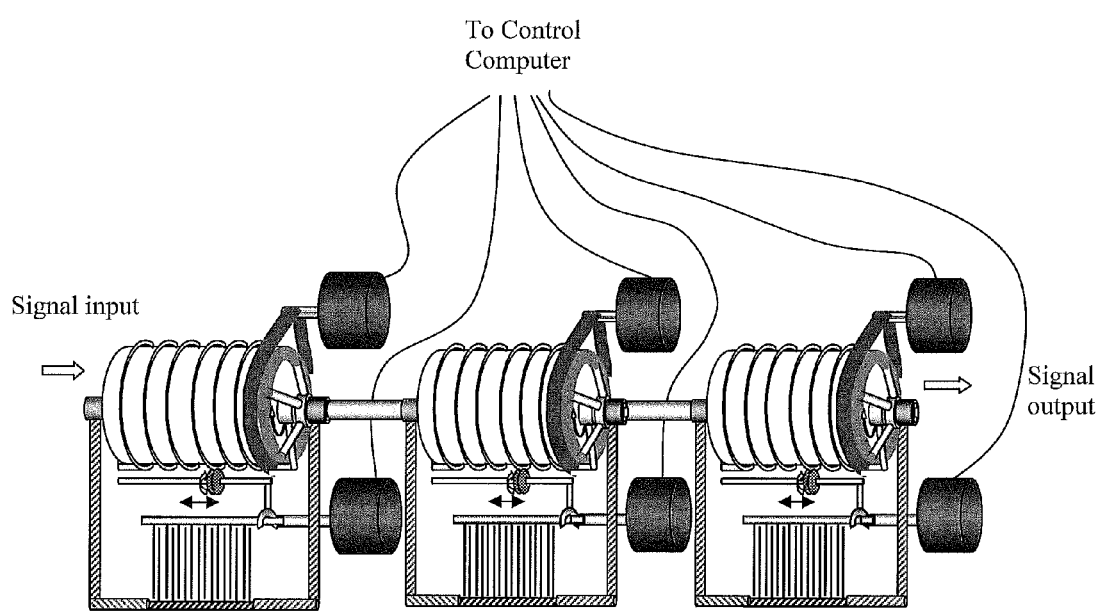
FIGURE 23: Three stage pre-matching or three-frequency harmonic tuner

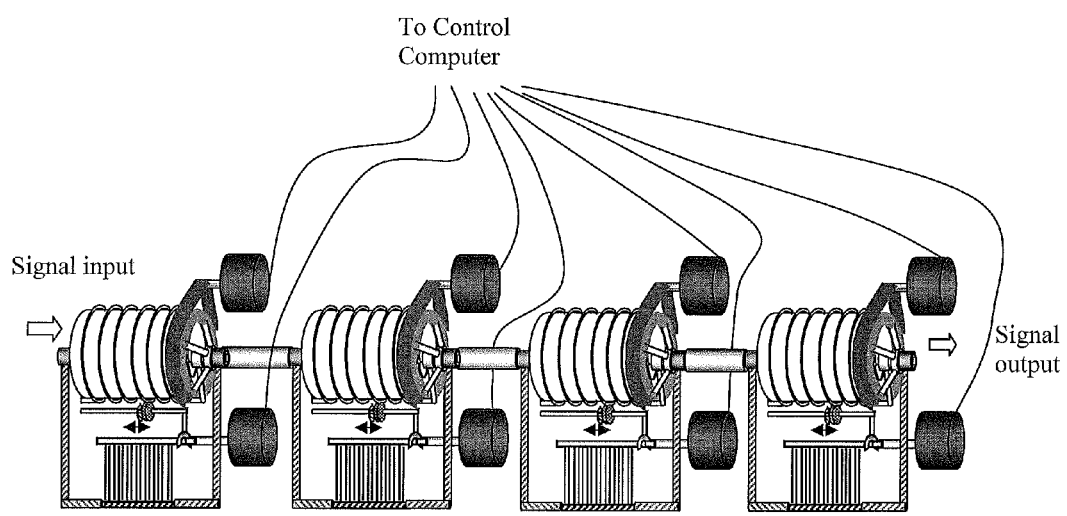
FIGURE 24: Four stage pre-matching or four-frequency harmonic tuner

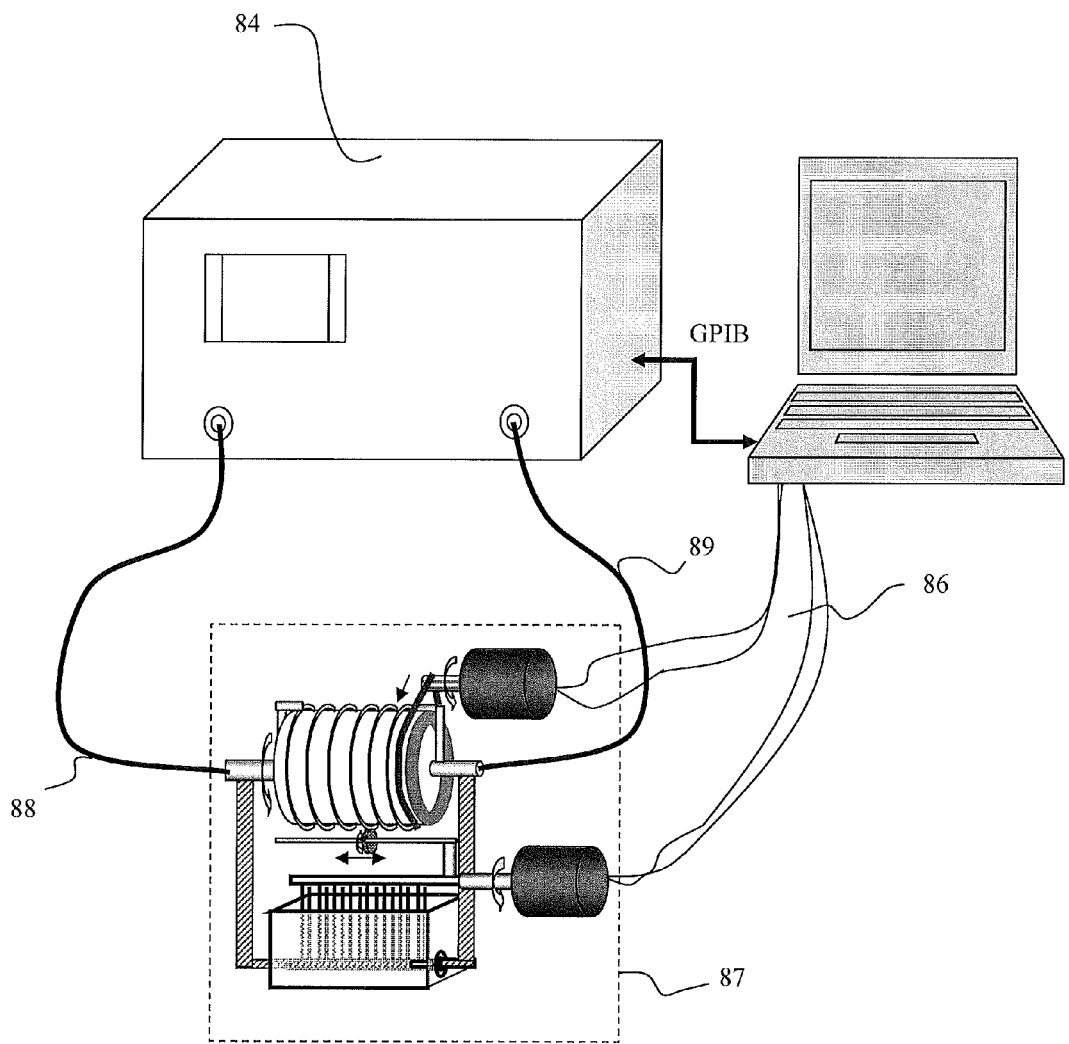
FIGURE 25: Tuner calibration setup

WIDEBAND LOW FREQUENCY IMPEDANCE TUNER

CROSS REFERENCE TO RELATED APPLICATIONS

This Application is a U.S. Continuation patent application of U.S. application Ser. No. 12/654,463, filed 22 Dec. 2009, the entire disclosure of which is incorporated herein by reference.

PRIORITY CLAIM

Not Applicable

CROSS-REFERENCE TO RELATED ARTICLES

[1] C. Tsironis, U.S. Pat. No. 6,674,293, Adaptable pre-matched tuner system and method.
[2] C. Tsironis, U.S. patent application Ser. No. 11,151,419, Low Frequency Electro-mechanical Impedance Tuner.
[3] http://www.comet.ch/en/products/vacuum-capacitors/datasheets
[4] F. Stengel, U.S. Pat. No. 5,771,026, Disguised Broadband Antenna System for Vehicles.
[5] C. Tsironis, U.S. patent application Ser. No. 11,643,855, Low frequency harmonic load pull tuner and method, FIGS. 7 to 10.
[6] http://www.palstar.com
[7] AppCad software: http://www.hp.woodshot.com
[8] C. Tsironis, U.S. Pat. No. 7,135,941, Triple probe automatic slide screw load pull tuner and method.
[9] C. Tsironis, U.S. patent application Ser. No. 12,457,187, Harmonic impedance tuner with four wideband probes and method.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to load pull testing of power transistors and noise testing of low noise transistors using automatic impedance tuners used in order to synthesize reflection factors (or complex impedances) at the input and output of said transistors.

A popular method for testing and characterizing RF components (transistors) for high power or low noise operation is "load pull" and "source pull". Load pull or source pull are computerized measurement techniques employing impedance tuners and other test equipment, such as signal sources, test fixtures to house the DUT (device under test, transistor) and input and output power meters (FIG. 1). To measure noise figure and noise parameters of a low noise device a similar setup is used (FIG. 2), in which the signal source is replaced by a calibrated standard noise source and the power meter by a sensitive noise figure analyzer, following a signal amplifying, low-noise amplifier. The tuners in particular are used in both setups, in order to manipulate the electrical impedance conditions under which the DUT is tested.

A popular family of electro-mechanical tuners, the "slide-screw tuners", use adjustable metallic probes (slugs) inserted into the transmission media of the tuners [1]. Said transmission media in RF and microwave frequencies is a slotted straight section of coaxial airline, typically manufactured as a parallel-plate structure (FIG. 3). Starting at the center of the Smith chart (FIG. 4, (4)) when the RF probe (1) is inserted further (6) into the slot of the slabline (3) the capacitive coupling with the center conductor (2) increases and so does the reflection factor (7). When the RF probe is moved along the slot and parallel to the axis of the slabline (8) the phase of the reflection factor changes until a desired reflection factor (9) is reached. This way the whole area of the Smith chart (5) can be covered (FIG. 4).

DESCRIPTION OF PRIOR ART

Full angle coverage of the Smith chart (5) requires the RF probe to move horizontally at least one half of a wavelength in free space at any given frequency. This corresponds to 180° from the test port of the tuner to the RF probe and 180° back, when the probe is at the far end relative to the test port. The wavelength at any given frequency is calculated using the simplified formula: Lambda [mm]=300/Frequency [GHz]. At 1 GHz one half of a wavelength corresponds to 15 cm, at 100 MHz to 1.5 meters and at 10 MHz to 15 meters. It is obvious that precision mechanical structures beyond 1.5 meters are either unconceivable or impractical. Therefore the slabline (slotted airline) method has been abandoned. An alternative technique for very low frequency tuners has been introduced by Tsironis [2] and uses at least three variable rotary capacitors C1 to C3, connected in parallel to ground between lengths of low loss coaxial cable L1 to L3 between the input (10) and output (11) ports, (FIG. 5). This technique allows for very low frequency tuners, as long as the capacitances are high enough. To determine the value of the capacitance required, in order to generate certain low impedance, we use the relation: $|Z_{min}|=1/(2*\pi*\text{Frequency [Hz]}*\text{Capacitance [Farad]})$. Typical examples are: For $Z_{min}=5\Omega$ at 5 MHz, the maximum capacitance needed is: $C_{max}=6.4$ nF=6,400 pF. Such tuners need this kind of variable capacitors in order to work. Scaling to lower frequencies and lower impedances is very simple: At 1 MHz the maximum capacitance needed is 31,000 pF and so on.

The only known apparatus [2], allowing user defined impedance tuning in the low MHz frequency range (1-100 MHz) comprises at least three variable capacitors, C1, C2, C3, connected to ground and three fixed, low loss transmission lines (L1, L2, L3) interconnecting the floating points of said capacitors (FIG. 5). When the transmission phase between capacitors is approximately 60°, at a given frequency (or 120° in reflection), a maximum Smith chart coverage by the reflection factor is created. Outside the center frequency, though, Smith chart coverage declines (FIG. 6, configuration 3C-3L). So, this solution is not inherently wideband. The same is valid for all alternatives of tuning circuits using series inductors and parallel variable capacitors [4].

Instantaneous frequency coverage can be improved if more than three parallel capacitors and associated fixed transmission lines are used. The transmission lines must then be optimized in length for said frequency coverage. FIG. 6 shows how the frequency coverage of the 3 capacitor-3 line tuner (3C-3L) compares, theoretically, with the here proposed one capacitor-one phase shifter tuner (1C-1PS). The 3C-3L tuner has the potential of reaching higher reflection in certain frequency ranges, but lacks wideband coverage. Also, due to the availability of high power variable capacitors (vacuum capacitors [3]) the 3C-3L (or nC-nL) family of tuners offers higher power handling capacity; n being 3, 4, 5 or higher. The proposed 1C-1PS tuner is limited in power handling due to the sliding (or rolling) contact on the linear phase shifter (FIG. 8) and we propose alternative solutions for this.

The true equivalent to slabline-based slide screw tuners [1] requires a transmission line (12, 13) and a parallel capacitor (15) connected between an adjustable point (14) on the transmission line and ground (FIG. 7). Though variable rotary capacitors exist that can be used at frequencies as low as 1 MHz (immersion into a high dielectric constant liquid may be required) and as high as several hundred MHz, without self resonances, one must always consider the size of the maximum capacitance in relation to self resonance. Self-resonance happens because the leads to the capacitance $C_{max}$ are in effect series inductances $L_s$ (FIG. 7) A series resonance occurs when $2\pi*Freq*L_s=1/(2\pi*Freq*C_{max})$, or at $Freq=1/(2\pi*sqrt(L_s*C_{max}))$. The higher the maximum capacitance the lower will be the self resonance frequency. The major issue is, though, the variable transmission line, needed for such tuners, for such low frequencies (sections X, L-X in FIG. 7). Line stretchers (FIG. 16) have been designed, but require still a large number of in-series sections [5, (FIGS. 7 to 10)] and precision control mechanisms to succeed. In this invention we propose an alternative solution based on a cylindrical structure combined with a variable capacitor, which emulates accurately the behavior of a slide screw tuner.

Other than that previous art is poor on the subject of wideband impedance tuners in the low MHz frequency range.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a load pull test set-up using passive electro-mechanical tuners.

FIG. 2 depicts prior art, a Noise measurement setup.

FIG. 3 depicts prior art, a perspective cross section of slabline based slide screw tuner.

FIG. 4 depicts prior art, the tuning mechanism of a slide screw tuner.

FIG. 5 depicts prior art, schematics of triple Line-Capacitor low frequency impedance tuner.

FIG. 6 depicts partly prior art, a comparison of frequency coverage of maximum reflection factor of a tuner with 3 capacitors and 3 fixed cables (3C-3L), a tuner with 5 capacitors and 5 fixed cables (5C-5L) and a tuner with one capacitor and one linear phase shifter (1C-1PS).

FIG. 7 depicts the principle of "one Capacitor—one Phase Shifter" Impedance Tuner.

FIG. 8 depicts a linear phase shifter using a spiraled rotating transmission line.

FIG. 9 depicts a cross section of linear phase shifter using a spiraled rotating transmission line.

FIG. 10 depicts the detailed cross section of coaxial adapter transition to rotating phase shifter.

FIG. 11 depicts a low frequency impedance tuner.

FIG. 12 depicts an automated low frequency impedance tuner

FIG. 13 depicts a automated low frequency impedance tuner with capacitor immersed in high $\in_r$ dielectric liquid.

FIG. 14a) depicts prior art, a variable rotary capacitor.

FIG. 14b) depicts prior art, a variable rotating inductor.

FIG. 15 depicts prior art a): schematics of variable rotating inductor, b) electrical symbol of variable inductor.

FIG. 16 depicts prior art, a) schematics of variable transmission line phase shifter, b) electrical symbol thereof.

FIG. 17 depicts prior art, a cross section of transmission line using dielectric (wire over ground-plane)

FIG. 18 depicts a) prior art, variable capacitor using concentric conductive cylinders, b) cross section of capacitor.

FIG. 19 depicts linear, high power, phase shifter using a spiraled rotating transmission line and asset of three contact wheels mechanically joined and electrically connected in parallel.

FIG. 20 depicts a linear, high power phase shifter using a spiraled rotating transmission line and a block of several adjacent and mechanically and electrically interconnected contact wheels.

FIG. 21 depicts a linear, high power phase shifter using a spiraled rotating transmission line and flexible cables to connect to the input, output and variable capacitor, in order to eliminate all not unavoidable sliding contacts.

FIG. 22 depicts a two stage pre-matching or two-frequency harmonic tuner.

FIG. 23 depicts a three stage pre-matching or three-frequency harmonic tuner.

FIG. 24 depicts a four stage pre-matching or four-frequency harmonic tuner.

FIG. 25 depicts a tuner calibration setup.

DETAILED DESCRIPTION OF THE INVENTION

The wideband MHz range impedance tuner comprises, in its simplest form (FIG. 7), one linear phase shifter (92) between test or input port (12) and idle or output port (13); and one variable capacitor (15), which is connected to said linear phase shifter using some sliding galvanic contact (14). Changing the position of said sliding contact (14) along the transmission line of said linear phase shifter creates a section X and a section L-X, assuming the total length of said transmission line to be L. Following the concept of the microwave slide screw impedance tuner, the electrical length of the in-line phase shifter has to be at least one half a wave-length at the lowest operation frequency. As we have seen before, the electrical length in air, required at 10 MHz is 15 meters and at 1 MHz it is 150 meters. There is no way such dimensions can be accommodated in a laboratory environment, if a linear approach is adopted.

The alternative approach described in this invention comprises two components: a) the use of some, readily available dielectric material (57), FIG. 17, with a dielectric constant $\in_r$ between 2 and 10. This reduces the effective electrical wavelength by a factor of $1/sqrt(\in_r)$. This method is used widely in electrical circuits, in order to support the main conductor (58) of transmission lines (56) and to reduce size. The drawback is increased loss, since any dielectric has higher loss than vacuum (or air). The loss/wavelength ratio is roughly constant, and depends on the dielectric material and other environmental conditions such as humidity etc.

In order to reduce the overall length of the linear phase shifter we use a "coil" approach. This technique is available commercially for short-wave radio-amateurs [6] where big inductors for the MHz frequency range are used (FIG. 14b). Said MHz frequency inductors (coils) are adjustable using a conductive wheel, so they can be combined with fixed capacitors in order to "tune" to a certain frequency. "Tuning" means, in this technology, creating a parallel resonance between the variable inductor (FIG. 14b) and a fixed capacitor, in order to maximize the impedance and by consequence the voltage detectable across said impedance for a given RF current.

In this invention we do not use variable coils, such as shown in FIG. 14b, neither do we use parallel resonances. We use a cylindrical transmission line structure to create a linear phase shifter and a running electrical contact (FIGS. 8, 9), in order to reduce the size of said linear phase shifter. This layout bears similarity with the geometry of the variable coils (FIG. 14b), but is different in nature, because the linear phase shifter of FIGS. 8 and 9 is not an inductor. In fact the coil of FIG. 14b does not have a ground plane below the coil wires. Also the coil wires in FIG. 14b are placed close to each-other in order to create magnetic coupling and increase the inductance. In the present apparatus (FIGS. 8, 9) the coil wires are placed at a distance such as to quasi eliminate electro-magnetic field coupling between wires (101). This ensures that the apparatus behaves as a transmission line, with given characteristic impedance Zo, which depends on the wire diameter (58), the thickness (59) and dielectric constant of the dielectric layer (57) between the wire (58) and the ground plane (56) in FIG. 17.

FIG. 8 shows in detail the mechanism of the rotating (24) cylindrical transmission line; it is made of a metallic cylinder (16) on which a layer of dielectric material (17) has been deposited, either chemically or in form of a plastic layer. Typical cheap material is Polyethylene, which is available in sheets of various thicknesses; any other dielectric material can be used. On top of said dielectric layer a metallic wire (23) (typically aluminum or copper) of certain diameter (typically 3 to 5 mm) is wound in spiral form. The two ends of said wire (93, 94) are bent towards the center of said cylinder and soldered on a central rotating ring (96, 97) which makes sliding contact with the center conductor (18) of a coaxial connector (see also FIG. 10). The metallic body of said cylinder (which is the ground plane of the whole assembly) is connected via a number of radial wires (98) with a second central metallic ring (99) which rotates with the main cylinder (16, 17) as well. This second ring (99) makes sliding contact with a fixed metallic ring (90), which is the outside conductor of a coaxial connector (see also FIG. 10). The conductors (18) and (90) are the building parts of a coaxial RF connector (FIG. 10). The same assembly is made on the opposite side of the cylinder (96) and forms the output port of the linear phase shifter. A metallic wheel (made using preferably aluminum or copper) (20) rolls (22) on the main spiral wire (23) when the main cylinder rotates (24); said wheel (20) then slides on the conductor (19) from the far left to the far right side. One end (123) of said conductor (19) is connected with the variable capacitor of the tuner (FIG. 11) thru a sliding contact (40). When the cylinder (16, 17) turns the wheel (20) advances and the amount of spiral wire (23) between the wheel (20) and the capacitor contact (19a) changes. This corresponds to the adjustable phase X in FIG. 7.

A detailed cross section of the linear phase shifter is shown in FIG. 9; The cylinder (25, 26) rotates around the axis (28) and the metallic wheel (30) rolls on the spiral wire (27) and advances (31) on the conductor (32). The end (109) of said conductor (32) is left open, while the other end (108) is connected to the variable capacitor (38) via the sliding contact (40), FIG. 11. The ground plane (26) is connected (102) with the central ring (105) and the conductor wire (27, 100) is connected with the second ring (104); ring (103) slides on ring (105) and ring (104) slides on the center conductor (106) of the RF connector; both rings (103 and 104) are separated by a dielectric cylinder (107) and lead to the external and internal conductor of the RF connector (FIG. 10). The wires (27) are spaced such (101) that coupling between each spire is small. The electric field is bent (101) towards ground (26) due to the close presence of ground and the dielectric layer (25).

FIG. 11 shows a more detailed cross section of the coaxial RF connector—cylindrical linear phase shifter transition. Both the ground plane and the main conductor are rotating and are connected permanently with two concentric rotating rings. Both said rings make sliding galvanic contact with the external and internal conductors of the RF connector. RF power is fed through the coaxial RF connector and the signal is traversing the spiral wire until it is picked by the travelling wheel (22 in FIGS. 8 and 30 in FIG. 9) and transferred to the variable capacitor (38) via another sliding contact (40 in FIG. 11). The center and external conductors of the RF connector are both cylinders and are separated and hold in place thru a nylon cylinder (107), which also determines the characteristic impedance of the whole transmission structure, which has to be the same over the whole assembly, including both RF coaxial connectors and the cylindrical wire-over-ground transmission line.

The overall low frequency impedance tuner assembly is shown in FIG. 11: The signal enters port (33) and travels on the wire (34) to the output (35). The metallic wheel (113) picks up part of the signal and feeds it to the variable capacitor (38, 39) thru the sliding contact (40). The axis (112) of said capacitor rotates and allows a variable amount of parallel metallic blades (38, 39) to face each other and thus adjust the value of the capacitance (FIG. 14a). The ground plane (36, 37) of said capacitor is connected electrically to the external conductor of the coaxial RF connector (110, 111). The whole assembly is mounted in an enclosure (41), which is then the impedance tuner itself. Typically this unit is automated by connecting stepper or servo motors to it (FIG. 12);

FIG. 12 shows the overall automated impedance tuner; two remotely controlled motors (51, 52) are connected to the rotating phase shifter cylinder (53) and the capacitor axis (47). A simple way to rotate the phase shifter cylinder is to attach a belt (116) on the axis (117) of the motor (51) and wound it around the cylinder (53) itself. Motor (52) is rotating the axis (47) of the capacitor (42), of which the ground plane (43, 46) is connected to the ground conductor of the coaxial RF connector (114, 115). The electrical control wires of both motors (48, 49) lead to the system control computer (85, FIG. 25).

Alternatively to the rotating capacitor (42, FIG. 14a) a coaxial capacitor can be used (FIG. 18). This later capacitor comprises a set of conductive cylinders (61, 60) which can be lowered into each other (FIG. 18b) using appropriate gear (63). The ground plane (62) is connected to the non-moving set of concentric cylinders (61). In this case the axis (50) of the motor (52), FIG. 12, must be modified to allow proper control of the capacitor gear (63).

For operation at very low frequencies (below 5-10 MHz) the maximum capacitance has to be of the order of several tenths of thousands of Pico-Farads, as has been explained before. Typical rotating or insertable capacitors reach values up to a couple of thousand Pico-Farads. To reach higher values of maximum capacitance a simple solution is to immerse said capacitors into high dielectric liquid. Oil has a dielectric constant of 2-3 and Alcohol can reach values between 16 and 30, depending of the chemical contents. In that case the necessary values of capacitance can easily be reached. FIG. 13 shows a simple arrangement of such a capacitor (55) immersed partially or entirely in dielectric liquid (54). The advantages for using this method are twofold: firstly the spurious inductors Ls (FIG. 7) leading to the capacitor do not change, as would be the case if we simply added parallel sections of capacitors in order to increase the capacitance. Secondly, immersion degree can be adjusted to the frequency of operation: at lower frequencies we immerse more, at higher frequencies less or not at all. In all cases the capacitance parts (immersed and non-immersed) add to the total capacitance.

FIGS. 15*a, b* show the schematics of an adjustable inductor (as in FIG. 14*b*) and the electrical symbol of it. This is shown in order to clarify and emphasize the structural difference to the adjustable linear phase shifter of FIG. 16. In FIG. 16*a* the schematics of a linear phase shifter (line stretcher) is shown and in FIG. 16*b* the electrical symbol of it. FIG. 17 shows the concept of a transmission line made using the "wire-over-ground" technique, used in this invention. The characteristic impedance of this transmission line depends on the diameter of the wire (58), the thickness (59) and dielectric constant of the dielectric sheet (57) used. Commercially available software programs allow precise calculations of said characteristic impedance [7]. Typical values are: For a wire with 3 mm diameter and an dielectric isolator layer with 2.25 dielectric constant (Polyethylene) and 50 Ohms characteristic impedance the thickness of the dielectric layer must be around 3.75 mm. The higher the dielectric constant the thicker said isolator layer will be.

The electrical length of a linear phase shifter (line stretcher), required for this type of impedance tuner is Lambda/2. At a minimum frequency of 1 MHz this corresponds to 150 meters in air. If a low cost dielectric material, such as Polyethylene with $\in_r=2.25$ is used, this becomes 150/sqrt (2.25)=100 meters. Using a cylindrical structure with a diameter of 30 cm, a 3.75 mm thick layer of the same dielectric material and a spiral wire with a diameter of 3 mm and allowing for a center-to-center space between wire spires of 9 mm, in order to minimize magnetic coupling between spires, it takes a total 106 wire spires and the total length of the phase shifter becomes approximately 955 mm, or less than 1 meter. This demonstrates the importance of using a spiral line stretcher. Based on this analysis, adaptations of these values to different minimum frequencies, diameters of the cylinder, dielectric material and space between wires are possible by simple analogy. For instance, if the Polyethylene dielectric is replaced by an Alumina (Ceramic with $\in_r=9.8$) tube of 15 cm diameter and a wall thickness of 20.5 mm, the whole surrounding a grounded metallic cylinder, then the total length of said spiral phase shifter will be roughly the same (945 mm).

Typical requirements for MHz frequency range impedance tuners include high power applications, of the order of 1 or more Kilowatts. In order to inject high power into a resistor the current to be applied is: Effective Current=sqrt (Power/Resistance) or: $I_{eff}$=sqrt (P/R); in case of P=1 kW and R=5Ω, the current is $I_{eff}$=14.14 Amperes. In order to ensure that the apparatus works reliably, RF currents of this or even higher order of magnitude may flow through the rolling contact (30, FIG. 9) and shall not degrade the contact too early; it is therefore needed to reduce the current through the contact. This can be done by dividing the current among several, connected in parallel contact wheels, as shown in FIGS. 19 and 20. The assembly required can be a set of wheels arranged mechanically in a cascade and connected electrically through their running axes (FIG. 19); it can be seen that wheels (64, 65) and (66) are connected in parallel thru the metallic bars (67, 68, 69) and (70, 71), so that the total current is divided (in this case) by a factor of three. At low frequencies the phase difference between the wheels is irrelevant.

A block of several wheels, also assembled mechanically together (76) and electrically in parallel (FIG. 20) can also be employed in order to reduce the current thru each wheel. In this case four wheels are connected as a block (72, 73, 74 and 75) and travel on one or two parallel axes (118, 119) connected in parallel to the output conductor (77). In this particular case the total RF current is divided by a factor of four. In all cases the current through each rolling contact is divided by the number of wheels, down to acceptable levels not threatening the reliability of the apparatus.

An alternative configuration, in which the contacting wheel (120) is not traveling, is shown in FIG. 21; in this case the cylinder with the spiral phase shifter (83) is moving instead (123). The cylinder (83) is driven by a threaded axis (78); also the sliding contact between the axis of the wheel (120) and the rotating (82) axis (121) and moving blades (122) of the capacitor can be replaced by a flexible cable (79). This later technique of using a flexible cable between the axis of the wheel (120) and the axis of the capacitor (121) is applicable to all hitherto configurations of the tuner in this invention and is not restricted to the configuration of FIG. 21.

In [1], [8] and [9] Tsironis discloses that, when a cascade of two, three or four identical or similar wideband impedance tuners, or tuning sections, is assembled, it is possible to either achieve higher reflection factors, by using the pre-matching tuning mechanism [1], or tune independently at two, three or four typically, but not exclusively, harmonic frequencies (2Fo, 3Fo, 4Fo) of a fundamental frequency Fo, [8, 9]; the only condition for this type of operation is that all tuners are able of generating high reflection factors at all said frequencies, being it two, three or four frequencies, simultaneously; if we cascade two, three or four identical tuners, as described hitherto in this invention, then existing calibration and tuning software algorithms [8, 9] can be used, or developed, to do independent tuning at said frequencies. FIGS. 22, 23 and 24 show said cascaded tuner configurations. Calibrating the cascade of tuners can be done either in assembled form [8, 9], or each tuner can be calibrated separately and the calibration data cascaded in computer memory.

The possibility of including a second and third independent contact wheel on the same spiral phase shifter wire, in order to create an "integrated" harmonic tuner, as in [8, 9], has been considered as a possibility, but does not offer, in this case, a practical alternative to the cascade of individual tuners; the reason being that, if all wheels run on the same wire simultaneously, the individual distance between wheels will not be adjustable, as is required for independent harmonic tuning. In order for this configuration to work, all wheels except one would have to be lifted from the wire, while the remaining wheel follows the rotation to be placed at a certain phase, then lifted and a second wheel would have to be lowered, be moved into the right position, and so on until all wheels are placed properly and all lowered to make contact. This technique is theoretically possible, though cumbersome and would require quite a complex mechanical arrangement to materialize.

In order to be able to synthesize specific impedances, the tuner must be pre-calibrated [1, 8 and 9]. This is possible using existing methods [1], in which the tuner is connected to a pre-calibrated network analyzer and a system computer adjusts the phase shifter and the capacitor positions such as to cover the reflection factor area on the Smith chart, while simultaneously retrieving scattering parameter data from the network analyzer using digital communication, such as GPIB or USB. FIG. 25 shows the required measurement setup. The tuner (87) is connected to the network analyzer (84) using low loss coaxial cables (88, 89) while at the same time the control computer (85) controls the two tuner motors (86) and reads data through the GPIB interface. The retrieved data are then saved in tuner calibration files in a format where the motor positions (typically in motor steps) are associated with two-port scattering parameters of the tuner and can be used later to reproduce said positions and associated impedances, knowing that the test port reflection factor is equal to the scattering parameter $S_{11}$, if the output port of the tuner is loaded with the characteristic impedance Zo of the transmission line of the phase shifter.

The present embodiment of this invention can easily be adapted to use alternative materials in order to increase dielectric constant and the size of the linear phase shifter and different types of variable capacitors to be connected to the phase shifter. Alternatively a single capacitor can be replaced by two or more capacitors connected in parallel, in order to increase the maximum capacitance; this shall not limit the basic concept and the overall scope of the present invention in using linear phase shifters and variable shunt capacitors for making a wideband, low frequency, computer controlled impedance tuner.

What I claim as my invention is:

1. A low frequency wideband impedance tuner comprising:
   a cylindrical transmission line, said cylinder being metallic, and said cylinder having a longitudinal axis;
   a dielectric layer on one surface of said cylinder;
   at least one wire extending radially from said cylinder to a first sliding contact;
   said first sliding contact being an electrical contact with a second sliding contact, said second sliding contact being in contact with an outside conductor of a transmission line;
   said cylinder, said wire and said first sliding contact being mounted to rotate around said axis;
   a linear phase shifter;
   said cylinder being a ground plane when in operation for said linear phase shifter, said linear phase shifter being mounted to be in operative electrical communication with said cylinder;
   a variable capacitor in operative electrical contact with said linear phase shifter and with said outside conductor of the transmission line;
   said variable capacitor and said linear phase shifter thereby being disposed to vary an impedance to a transmission signal.

2. The tuner of claim 1 wherein said electrical contacts with said transmission line are contacts with a coaxial transmission connector.

3. The tuner of claim 1 wherein said connection to said transmission line comprises one of an input or an output port and further comprising a third sliding contact and a fourth sliding contact establishing operative electrical connection between said cylindrical transmission line and the other of an input port or an output port and said variable capacitor being in operative electrical contact with the other of said output port or said input port.

4. The tuner of claim 1 wherein at least one of said sliding electrical contacts is annular.

5. The tuner of claim 1 wherein said dielectric is on an outside surface of said cylindrical transmission line.

6. The tuner of claim 1 wherein said linear phase shifter rotates with said cylinder.

7. The tuner of claim 1 wherein said linear phase shifter is in operative electrical contact with a center pin of said transmission line.

8. An impedance tuner as in claim 1, in which said variable capacitor is a rotating capacitor with a set of rotating conductive blades and a set of interdigitally placed fixed conductive blades, the number of said blades and their size determining the range of capacitance available for tuning purposes.

9. An impedance tuner as in claim 1, in which said variable capacitor is a concentric conductive cylinder structure, in which one set of concentric cylinders is fixed and one set is movable and can be lowered interdigitally into the fixed set in order to adjust the capacitance value; said number of concentric cylinders, their height and radius are selected such as to determine the range of capacitance available for tuning.

10. An impedance tuner as in claim 1, in which said variable capacitor can be partially or fully immersed in dielectric fluid in order to increase and adjust the range of capacitance that can be created by said variable capacitor.

11. An impedance tuner as in claim 1, in which said variable capacitor is replaced by a set of two or more such capacitors, connected in parallel, such that a maximum value of capacitance that can be increased.

12. An impedance tuners as in claim 1, further comprising a second tuner cascaded with said tuner whereby said cascaded tuner can perform at least one pre-matched tuning, independent two-frequency tuning or two harmonic frequency impedance tuning.

13. The tuner of claim 1 wherein said linear phase shifter is a spiral wire.

14. The tuner of claim 13 wherein said linear phase shifter is further comprised of a moving contact disposed to maintain electrical contact with said spiral wire and to translate axially as said cylinder and said spiral wire rotate.

15. An impedance tuner as in claim 1, further comprising said linear phase shifter having at least one rolling contact wheel running on a wire of a spiral phase shifter.

16. An impedance tuner as in claim 15, further comprising said linear phase shifter having at least one additional rolling contact wheel, assembled mechanically together and interconnected electrically and running simultaneously on a wire of a spiral phase shifter, such that a current density through each said rolling contact is reduced.

17. A low frequency wideband impedance tuner comprising:
   a cylindrical ground plane;
   a linear phase shifter in operative electrical communication with said cylindrical ground plane;
   said linear phase shifter comprising:
   a spiral around said cylindrical ground plane, said spiral being substantially coaxial with said cylindrical ground plane;
   said linear phase shifter rotating with said cylindrical ground plane;
   said linear phase shifter being in operative electrical contact with a center pin of a linear transmission line via a radial wire;
   said spiral wire having a plurality of windings around said cylindrical ground plane, said windings being spaced axially such that electromagnetic field coupling between said windings is reduced;
   said linear phase shifter further comprising a travelling wheel, said wheel being disposed to translate axially while maintaining electrical contact with said spiral, as said spiral rotates;
   said travelling wheel being in operative electrical contact with an outside conductor of a coaxial transmission line, said operative electrical contact between said travelling wheel and said transmission line being through a variable capacitor;
   such that said linear phase shifter and said variable capacitor are disposed to vary an impedance to a signal through said transmission line.

18. The tuner of claim 17 wherein said operative electrical connections with said transmission lines are connections with coaxial connectors comprising at least one of an input port or an output port of said tuner.

19. The tuner of claim 17 further comprising:
- a cylindrical transmission line, said cylinder being metallic, and said cylinder having a longitudinal axis;
- a dielectric layer on one surface of said cylinder;
- at least one wire extending radially from said cylinder to a first sliding contact;
- said first sliding contact being an electrical contact with a second sliding contact, said second sliding contact being in contact with an outside conductor of a transmission line;
- said cylinder, said wire and said first sliding contact being mounted to rotate around said axis;
- a linear phase shifter;
- said cylinder being a ground plane when in operation for said linear phase shifter, said linear phase shifter being mounted to be in operative electrical communication with said cylinder;
- a variable capacitor in operative electrical contact with said linear phase shifter and with said outside conductor of the transmission line;
- said variable capacitor and said linear phase shifter thereby being disposed to vary an impedance to a transmission signal.

20. The tuner of claim 17 further comprising a dielectric interposed between said linear phase shifter and cylindrical ground plane.

21. The tuner of claim 17 wherein a distance between one end of said spiral and said travelling wheel defines at least one of an electrical length and a phase position.

22. The tuner of claim 17 wherein said spiral is a spiral wire.

23. An impedance tuner as in claim 17, in which said variable capacitor is a rotating capacitor with a set of rotating conductive blades and a set of interdigitally placed fixed conductive blades, the number of said blades and their size determining the range of capacitance available for tuning purposes.

24. An impedance tuner as in claim 17, in which said variable capacitor is a concentric conductive cylinder structure, in which one set of concentric cylinders is fixed and one set is movable and can be lowered interdigitally into the fixed set in order to adjust the capacitance value; said number of concentric cylinders, their height and radius are selected such as to determine the range of capacitance available for tuning.

25. An impedance tuner as in claim 17, in which said variable capacitor can be partially or fully immersed in dielectric fluid in order to increase and adjust the range of capacitance that can be created by said variable capacitor.

26. An impedance tuner as in claim 17, further comprising said linear phase shifter having at least one additional rolling contact wheel, assembled mechanically together and interconnected electrically and running simultaneously on a wire of a spiral phase shifter, such that a current density through each said rolling contact is reduced.

27. An impedance tuner as in claim 17, in which said variable capacitor is replaced by a set of two or more such capacitors, connected in parallel, such that a maximum value of capacitance that can be increased.

28. An impedance tuners as in claim 17, further comprising a second tuner cascaded with said tuner whereby said cascaded tuner can perform at least one pre-matched tuning, independent two-frequency tuning or two harmonic frequency impedance tuning.

29. A calibration method for an impedance tuner comprising:
- connecting said tuner to a pre-calibrated network analyzer;
- measuring scattering parameters for a set of phases of the linear phase shifter and capacitance settings of the variable capacitor, in such a way as to cover a maximum reflection factor area on the Smith chart at any given frequency;
- saving said scattering parameters in tuner calibration files for later reproduction (tuning) of said calibrated reflection factors;

wherein said tuner comprises;
- a cylindrical transmission line, said cylinder being metallic, and said cylinder having a longitudinal axis;
- a linear phase shifter;
- said cylinder being a ground plane when in operation for said linear phase shifter, said linear phase shifter being mounted to be in operative electrical communication with said cylinder;
- a variable capacitor in operative electrical contact with said linear phase shifter and with said outside conductor of the transmission line;
- said variable capacitor and said linear phase shifter thereby being disposed to vary an impedance to a transmission signal.

* * * * *